(12) United States Patent
Fukushima et al.

(10) Patent No.: US 11,338,448 B2
(45) Date of Patent: May 24, 2022

(54) SUBSTRATE GRIPPING HAND AND SUBSTRATE TRANSFER DEVICE INCLUDING THIS SUBSTRATE GRIPPING HAND

(71) Applicant: KAWASAKI JUKOGYO KABUSHIKI KAISHA, Kobe (JP)

(72) Inventors: Takayuki Fukushima, Takarazuka (JP); Tetsuya Yoshida, Kakogawa (JP); Shinya Kinoshita, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 335 days.

(21) Appl. No.: 16/344,946

(22) PCT Filed: Oct. 17, 2017

(86) PCT No.: PCT/JP2017/037586
§ 371 (c)(1),
(2) Date: Apr. 25, 2019

(87) PCT Pub. No.: WO2018/079351
PCT Pub. Date: May 3, 2018

(65) Prior Publication Data
US 2019/0263003 A1    Aug. 29, 2019

(30) Foreign Application Priority Data

Oct. 27, 2016 (JP) .............................. JP2016-210757

(51) Int. Cl.
*B25J 15/00* (2006.01)
*B65G 49/07* (2006.01)
(Continued)

(52) U.S. Cl.
CPC ........... *B25J 15/0033* (2013.01); *B25J 15/00* (2013.01); *B65G 49/07* (2013.01);
(Continued)

(58) Field of Classification Search
None
See application file for complete search history.

(56) References Cited

U.S. PATENT DOCUMENTS 5,061,144 A * 10/1991 Akimoto ........... H01L 21/68707
414/222.02
7,048,316 B1 * 5/2006 Blank ................ H01L 21/67748
294/213
(Continued)

FOREIGN PATENT DOCUMENTS

JP    H11-116046 A    4/1999
JP    H11-121579 A    4/1999
(Continued)

*Primary Examiner* — Michael S Lowe
(74) *Attorney, Agent, or Firm* — Oliff PLC (57) ABSTRACT

A substrate gripping hand which grips a substrate with a disc shape, includes a base plate, and a guide member provided at the base plate, and having a L-shape when viewed from a horizontal direction, the guide member having a shape in which a base end portion of a bottom surface has a horizontal portion and a first corner portion which is a corner portion formed by the bottom surface and an inner wall surface has a curve line shape.

13 Claims, 8 Drawing Sheets

(51) Int. Cl.
*H01L 21/687* (2006.01)
*H01L 21/677* (2006.01)

(52) U.S. Cl.
CPC .. *H01L 21/67766* (2013.01); *H01L 21/67778* (2013.01); *H01L 21/68707* (2013.01); *H01L 21/68728* (2013.01); *H01L 21/677* (2013.01)

(56) References Cited

U.S. PATENT DOCUMENTS 9,425,076 B2 * 8/2016 Agarwal ........... H01L 21/68707
10,475,691 B2 * 11/2019 Maruyama ........... B25J 15/0038

FOREIGN PATENT DOCUMENTS

| | | |
|---|---|---|
| JP | 2003-229467 A | 8/2003 |
| JP | 2012-212751 A | 11/2012 |
| WO | 2016/003598 A1 | 1/2016 |

* cited by examiner

SUBSTRATE GRIPPING HAND AND SUBSTRATE TRANSFER DEVICE INCLUDING THIS SUBSTRATE GRIPPING HAND

TECHNICAL FIELD

The present invention relates to a substrate gripping hand and a substrate transfer device including this substrate gripping hand.

BACKGROUND ART

A semiconductor wafer (semiconductor substrate: hereinafter will simply be referred to as a wafer or substrate) is subjected to multiple treatments and manufactured inside a clean room. The semiconductor wafer is transferred by a robot disposed inside the clean room between the treatments. As the robot disclosed inside the clean room, there is known a robot including a hand for gripping the outer peripheral surface of the wafer (e.g., see Patent Literatures 1 and 2).

In the robot disclosed in Patent Literature 1, the inner side wall of a wafer guide for gripping the wafer has a circular-arc shape in a top plan view, conforming to the outer diameter of the wafer. In the robot disclosed in Patent Literature 2, the inner side wall of a wafer guide has an inclined surface which is inclined (slanted) inward, from its upper surface toward its lower side. In the robots disclosed in Patent Literatures 1 and 2, the outer peripheral surface of the wafer is gripped by the inner side wall of the wafer guide with the above-described shape.

CITATION LIST

Patent Literature

Patent Literature 1: Japanese Laid-Open Patent Application Publication No. Hei. 11-121579
Patent Literature 2: Japanese Laid-Open Patent Application Publication No. Hei. 11-116046

SUMMARY OF INVENTION

Technical Problem

However, in the robots disclosed in Patent Literatures 1 and 2, the wafer is gripped by the side wall with the circular-arc shape or the inclined surface. For this reason, it is difficult to grip the wafer in a horizontal state. This may lead to a situation in which the wafer is transferred in an inclined (tilted) state.

The present invention is directed to solving the above-described problem associated with the prior art, and an object of the present invention is to provide a substrate gripping hand which is capable of easily gripping (holding) and transferring a substrate in a horizontal state, and a substrate transfer device including this substrate gripping hand.

Solution to Problem

To solve the above-described problem associated with the prior art, according to the present invention, a substrate gripping hand which grips a substrate with a disc shape, comprises: a base plate; and a guide member provided at the base plate, and having a L-shape when viewed from a horizontal direction, the guide member having a shape in which a base end portion of a bottom surface has a horizontal portion and a first corner portion which is a corner portion formed by the bottom surface and an inner wall surface has a curve line shape.

In accordance with this configuration, the substrate gripping hand of the present invention is capable of easily gripping and transferring in the horizontal state the substrate placed on the horizontal portion of the guide member. Even in a case where the end portion of the substrate collides with the inner wall surface of the guide member due to, for example, a vibration, while the substrate is gripped and transferred, an impact generated by the collision can be mitigated because the first corner portion has the curve line shape. In addition, even in a case where the substrate is tilted due to, for example, a vibration, while the substrate is gripped and transferred, the end portion of the substrate moves along (slides down on) the first corner portion with the curve line shape. In this way, the substrate can return to the horizontal state. In brief, the guide member of the substrate gripping hand according to the present invention has a self-aligning function.

A substrate transfer device according to the present invention comprises the above-described substrate gripping hand.

In accordance with this configuration, the substrate transfer device of the present invention is capable easily gripping and transferring in the horizontal state the substrate placed on the horizontal portion of the guide member. Even in a case where the end portion of the substrate collides with the inner wall surface of the guide member due to, for example, a vibration, while the substrate is transferred, an impact generated by the collision can be mitigated because the first corner portion has the curve line shape. In addition, even in a case where the substrate is tilted due to, for example, a vibration, while the substrate is transferred, the end portion of the substrate moves along (slides down on) the first corner portion with the curve line shape. In this way, the substrate can return to the horizontal state.

Advantageous Effects of Invention

A substrate gripping hand and a substrate transfer device including this substrate gripping hand, of the present invention, are capable of easily gripping and transferring a substrate in a horizontal state.

DESCRIPTION OF EMBODIMENTS

Hereinafter, the embodiments of the present invention will be described with reference to the drawings. Throughout the drawings, the same or corresponding constituents are designated by the same reference symbols, and detailed description of them will be omitted. Throughout the drawings, the constituents for describing the present invention are extracted and shown, and the other constituents are not shown in some cases. The present invention is not limited to the embodiments described below.

Embodiment 1

A substrate gripping hand which grips a substrate with a disc shape, according to Embodiment 1, comprises a base plate; and a guide member provided at the base plate, and having a L-shape when viewed from a horizontal direction, the guide member having a shape in which a base end portion of a bottom surface has a horizontal portion and a first corner portion which is a corner portion formed by the bottom surface and an inner wall surface has a curve line shape.

In the substrate gripping hand according to Embodiment 1, the guide member may be disposed at the substrate gripping hand so that an end portion of the substrate is placed on the horizontal portion.

In the substrate gripping hand according to Embodiment 1, the guide member may be disposed at the base plate so that an outermost end of a main surface of the substrate is placed on the horizontal portion.

In the substrate gripping hand according to Embodiment 1, the guide member may be disposed at the base plate so that an outermost end of a main surface of the substrate overlaps with the horizontal portion, when viewed from a normal direction of the base plate.

In the substrate gripping hand according to Embodiment 1, the horizontal portion may have a length of 0.2 mm to 3.0 mm.

In the substrate gripping hand according to Embodiment 1, the first corner portion of the guide member may be curved.

In the substrate gripping hand according to Embodiment 1, the first corner portion of the guide member may have a circular-arc shape.

In the substrate gripping hand according to Embodiment 1, the first corner portion of the guide member may have a curvature radius of 0.5 mm or more.

In the substrate gripping hand according to Embodiment 1, the guide member may have a shape in which the bottom surface is inclined so that a tip end portion of the bottom surface has a thickness reduced toward a tip end thereof.

In the substrate gripping hand according to Embodiment 1, the inner wall surface of the guide member may be inclined so that an angle formed between the horizontal portion and the inner wall surface is an obtuse angle.

A substrate transfer device according to Embodiment 1 comprises any one of the above-described substrate gripping hands.

Hereinafter, a substrate gripping hand and a substrate transfer device including this substrate gripping hand according to Embodiment 1 will be described with reference to FIGS. 1 to 7.

[Configuration of Semiconductor Treatment Equipment]

Figure 1:
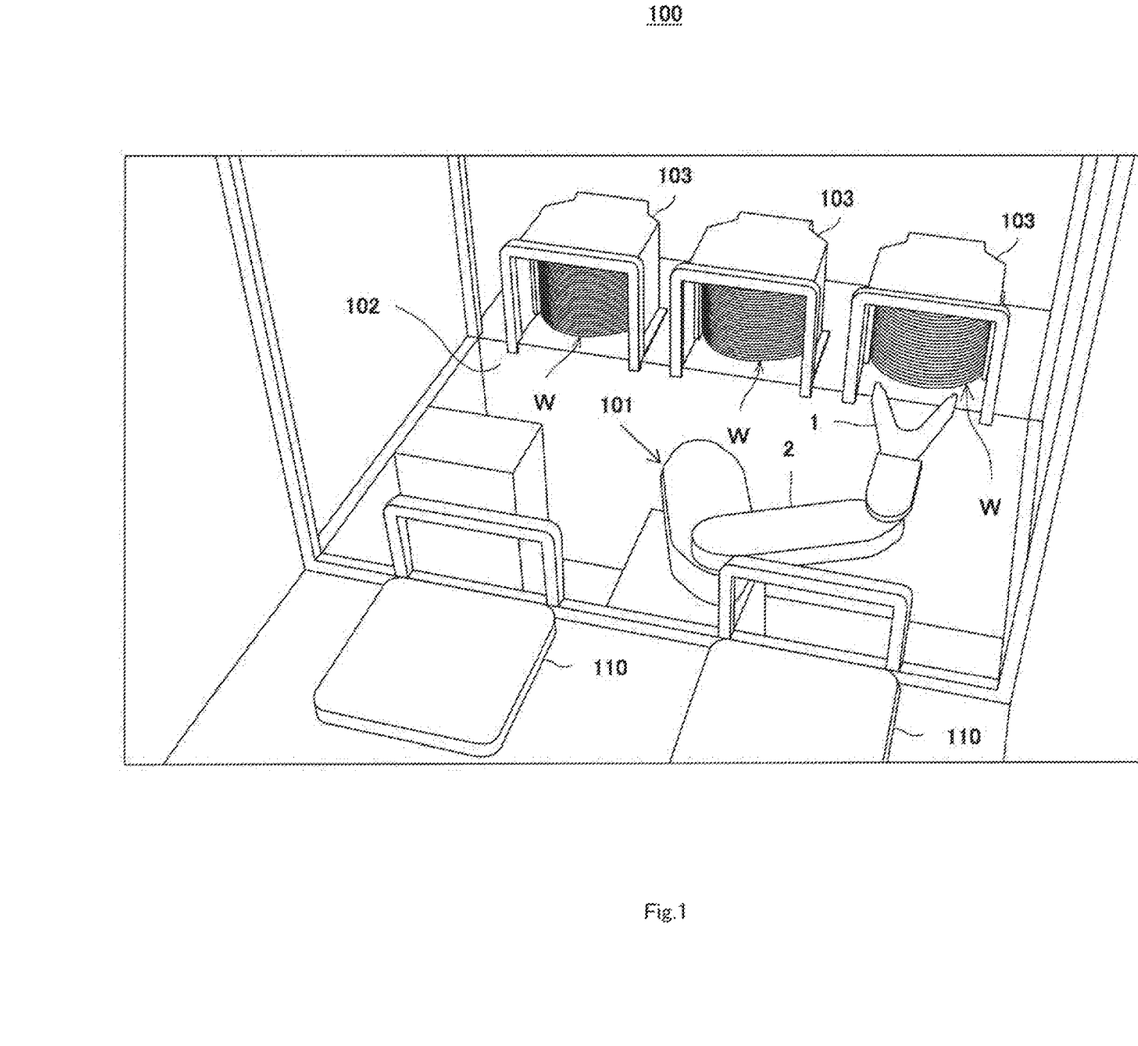
FIG. 1 is a perspective view showing the schematic configuration of semiconductor treatment equipment including a substrate transfer device according to Embodiment 1.

FIG. 1 is a perspective view showing the schematic configuration of semiconductor treatment equipment including a substrate transfer device according to Embodiment 1.

As shown in FIG. 1, semiconductor treatment equipment 100 includes a substrate transfer device 101 according to Embodiment 1, containers 103 disposed on a base 102, and substrate treatment devices 110. The semiconductor treatment equipment 100 is configured to perform treatments to substrates W. Specifically, the substrate transfer device 101 is configured to grip the substrate W stored (accommodated) in the container 103, transfer the substrate W to the substrate treatment device 110, and perform a treatment to the substrate W inside the substrate treatment device 110. As the treatments performed to the substrate W, there are process treatments such as a thermal treatment, an impurity implantation treatment, a thin film formation treatment, a lithography treatment, a washing (cleaning) treatment, and a flattening treatment.

Next, the configuration of the substrate transfer device according to Embodiment 1 and the configuration of the container will be described with reference to FIGS. 1 to 4.

Figure 2:
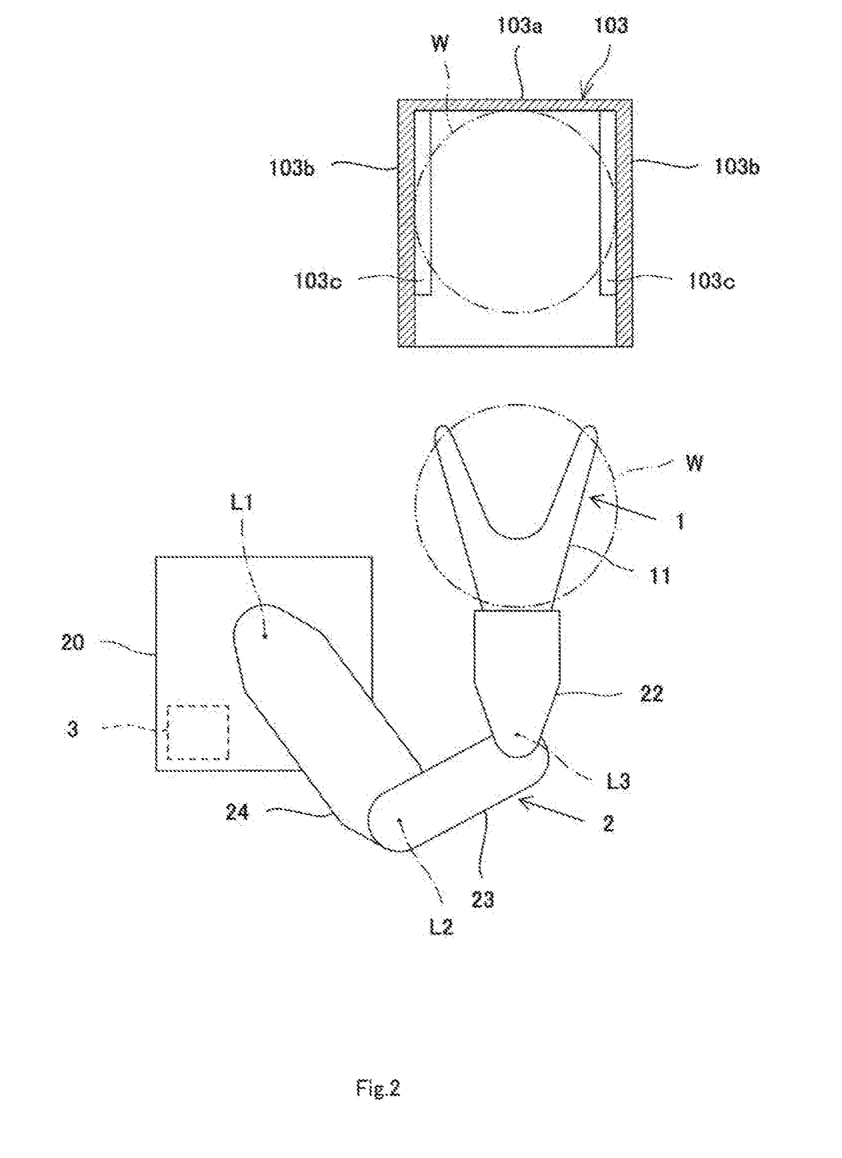
FIG. 2 is a top plan view showing the schematic configuration of the substrate transfer device according to Embodiment 1 and a container.
Figure 3:
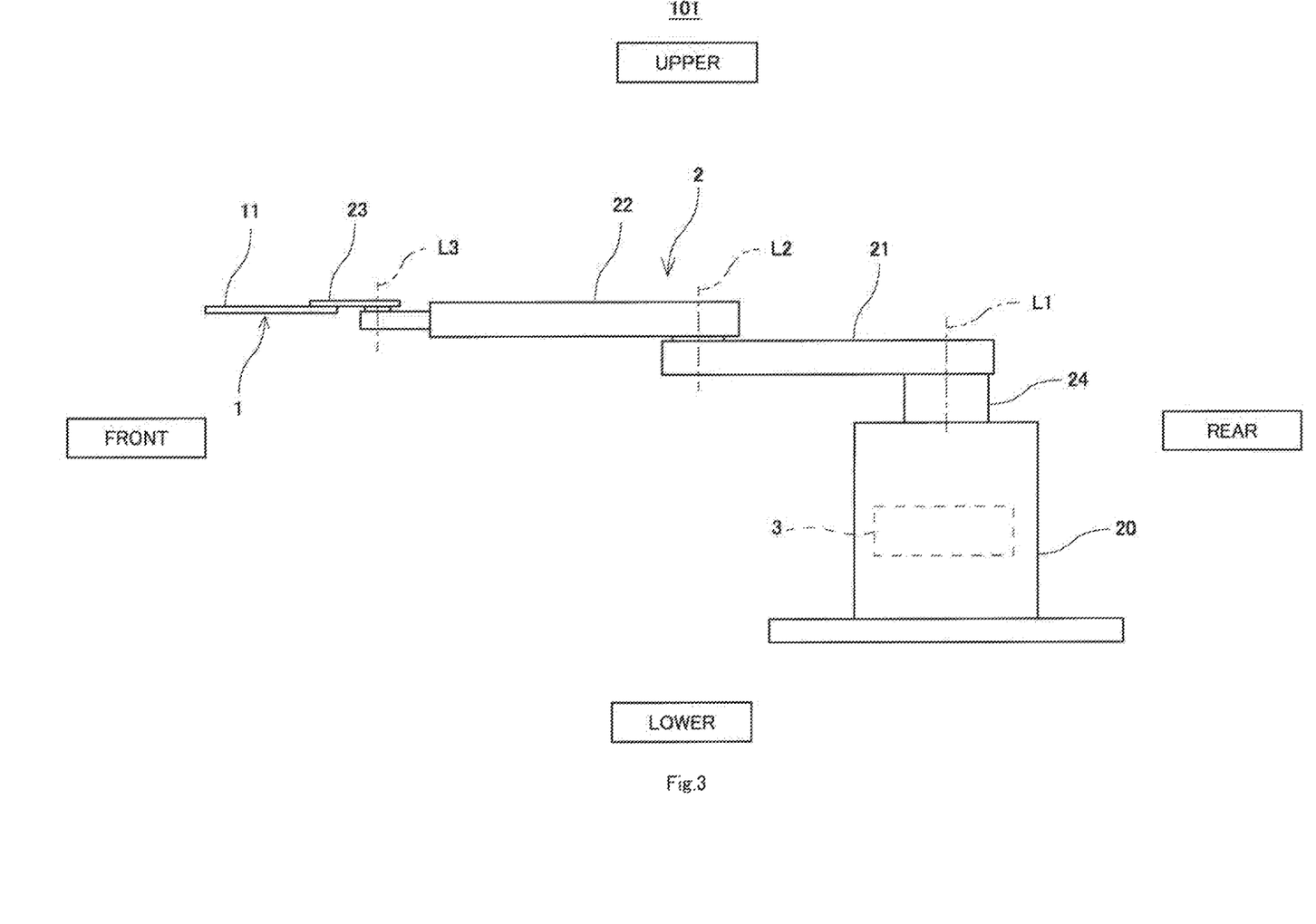
FIG. 3 is a side view showing the schematic configuration of the substrate transfer device according to Embodiment 1.
Figure 4:
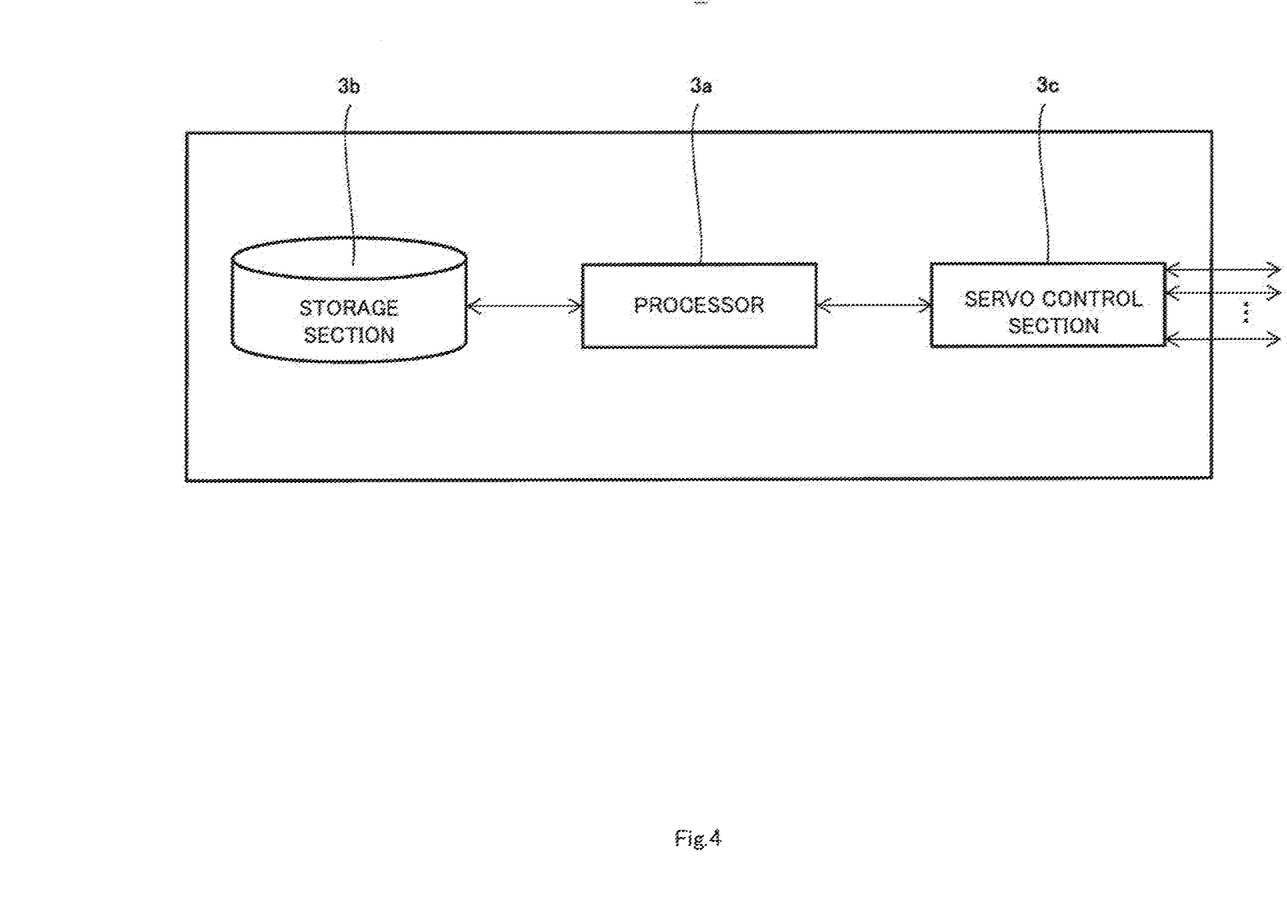
FIG. 4 is a functional block diagram showing the schematic configuration of a controller of the substrate transfer device of FIG. 2.

FIG. 2 is a top plan view showing the schematic configuration of the substrate transfer device according to Embodiment 1 and the container. FIG. 3 is a side view showing the schematic configuration of the substrate transfer device according to Embodiment 1. FIG. 4 is a functional block diagram showing the schematic configuration of a controller of the substrate transfer device of FIG. 2.

FIG. 2 shows the horizontal cross-section of the container. FIG. 3 shows that upper and lower sides and front and rear sides of the substrate transfer device are upper and lower sides and front and rear sides in the drawing.

As shown in FIGS. 1 and 2, the container 103 includes a box 103a whose front side is open, and substrate support parts 103c provided at the inner surfaces of a pair of side walls 103b of the box 103a. The container 103 accommodates therein a plurality of substrates W. The substrate support parts 103c have a rectangular shape. The substrate support parts 103c extend in a horizontal direction and are arranged at equal intervals (e.g., 5 to 15 mm intervals) in a vertical direction. Each of the substrates W is placed on the upper surfaces of the substrate support parts 103c.

Each of the substrates W may be a thin plate with a disc shape which is a substrate material of a semiconductor device, such as a semiconductor substrate or a glass substrate. The semiconductor substrate may be, for example, a silicon substrate, a sapphire substrate (monocrystal alumina) substrate, or other substrates. The glass substrate may be a glass substrate for FPD (flat panel display), or a glass substrate for MEMS (micro electro mechanical systems).

As shown in FIGS. 1 to 3, the substrate transfer device 101 includes a substrate gripping hand 1, a manipulator 2, and a controller 3. The substrate gripping hand 1 will be described later. Hereinafter, the configuration of a horizontal articulated robot will be described as the manipulator 2. However, the manipulator 2 is not limited to the horizontal articulated robot and may be based on a vertical articulated robot.

The manipulator 2 includes a base 20, a first link 21, a second link 22, and a third link 23. The controller 3 is disposed inside the base 20. The base 20 is provided with an up-down shaft 24. The up-down shaft 24 includes, for example, a ball screw mechanism (not shown), a driving motor (not shown), a rotation sensor (not shown) which detects the rotation position of the driving motor, and a current sensor (not shown) which detects an electric current for controlling the rotation of the driving motor. The up-down shaft 24 is configured to be vertically extended and contracted. Note that the driving motor may be, for example, a servo motor which is servo-controlled by the controller 3. The rotation sensor may be, for example, an encoder.

The base end portion of the first link 21 is connected to the up-down shaft 24 so that the first link 21 is rotatable around a rotation axis L1 extending through the center axis of the up-down shaft 24. The base end portion of the second link 22 is connected to the tip end portion of the first link 21 so that the second link 22 is rotatable around a rotation axis L2. The base end portion of the third link 23 is connected to the tip end portion of the second link 22 so that the third link 23 is rotatable around a rotation axis L3. The rotation axis L1, the rotation axis L2, and the rotation axis L3 are parallel to each other. In Embodiment 1, the rotation axis L1, the rotation axis L2, and the rotation axis L3 extend in a vertical direction.

The substrate gripping hand 1 is connected to the tip end portion of the third link 23. The substrate gripping hand 1 will be described later.

The manipulator 2 includes driving motors, driving force transmission mechanisms, rotation sensors, and current sensors (these are not shown) which rotate the first link 21, the second link 22, and the third link 23 around the corresponding rotation axes L1 to L3, respectively. Note that the driving motors may be, for example, servo motors which are servo-controlled by the controller 3. The rotation sensors may be, for example, encoders.

As shown in FIG. 4, the controller 3 includes a processor 3a such as a CPU, a storage section 3b such as ROM or RAM, and a servo control section 3c. The controller 3 is, for example, a robot controller including a computer such as a microcontroller.

The controller 3 may be a single controller 3 which performs a centralized control or may be a plurality of controllers 3 which perform a distributed control. Although in Embodiment 1, the storage section 3b is disposed within the controller 3, this is exemplary. The storage section 3b may be separate from the controller 3.

The storage section 3b contains therein information such as base programs for the robot controller and fixed data. The processor 3a reads and executes software such as the base programs stored in the storage section 3b, to control the operations of the manipulator 2. Specifically, the processor 3a generates control commands for the manipulator 2 and outputs the control commands to the servo control section 3c. The servo control section 3c is configured to control driving of the servo motors which rotate the rotation axes corresponding to the first link 21, the second link 22, and the third link 23, respectively, in response to the control commands generated by the processor 3a.

Next, the configuration of the substrate gripping hand 1 will be described in detail with reference to FIGS. 5 and 6.

Figure 5:
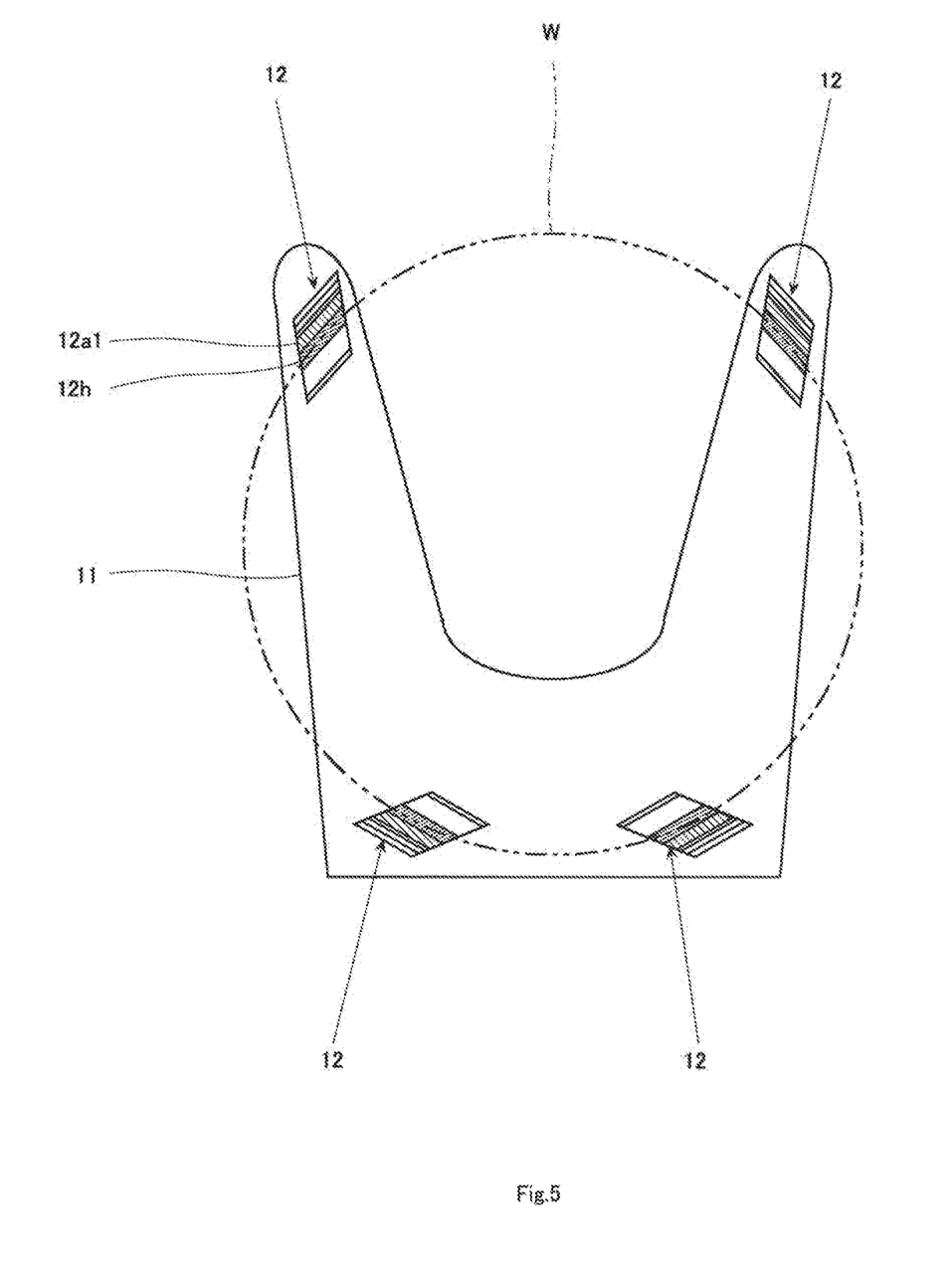
FIG. 5 is a top plan view showing the schematic configuration of a substrate gripping hand of FIG. 1.

FIG. 5 is a top plan view showing the schematic configuration of the substrate gripping hand of FIG. 1 (the substrate gripping hand according to Embodiment 1). FIG. 6 is an enlarged side view showing a region that is in the vicinity of a guide member of the substrate gripping hand of FIG. 5. In FIG. 5, horizontal portions and first corner portions of the guide members are hatched. In FIG. 6, the directions of the substrate gripping hand are expressed as the directions of X-axis, Y-axis, and Z-axis in a three-dimensional orthogonal coordinate system. In FIG. 6, a state in which the substrate vibrates is indicated by one-dotted lines.

As shown in FIG. 5, the substrate gripping hand 1 includes a base plate 11 and guide members 12. The base plate 11 has a substantially-U shape (or substantially-Y shape) in a front view. The substrate W is placed on the upper surface of the base plate 11. As described above, the substrate W has the disc shape. A corner portion Wa formed by the main surface (upper surface or lower surface) of the substrate W and a peripheral surface Ws of the substrate W is rounded (see FIG. 6). Alternatively, the corner portion Wa may be formed by cutting a portion of the substrate W, or may be provided at the substrate W. The base end portion of the base plate 11 is fastened to the tip end portion of the second link 22 by a suitable fastening member.

At least one guide member 12 is provided at each of the base end portion and the tip end portion of the base plate 11. In other words, at least one guide member 12 may be provided at the base end portion of the base plate 11 and at least one guide member 12 may be provided at the tip end portion of the base plate 11.

Specifically, the guide members 12 are provided at suitable locations of the base plate 11 so that the end portion of the substrate W can be placed on horizontal portions 12h which will be described later. In Embodiment 1, two guide members 12 are provided at the base end portion of the base plate 11 and two guide members 12 are provided at the tip end portion of the base plate 11.

Figure 6:
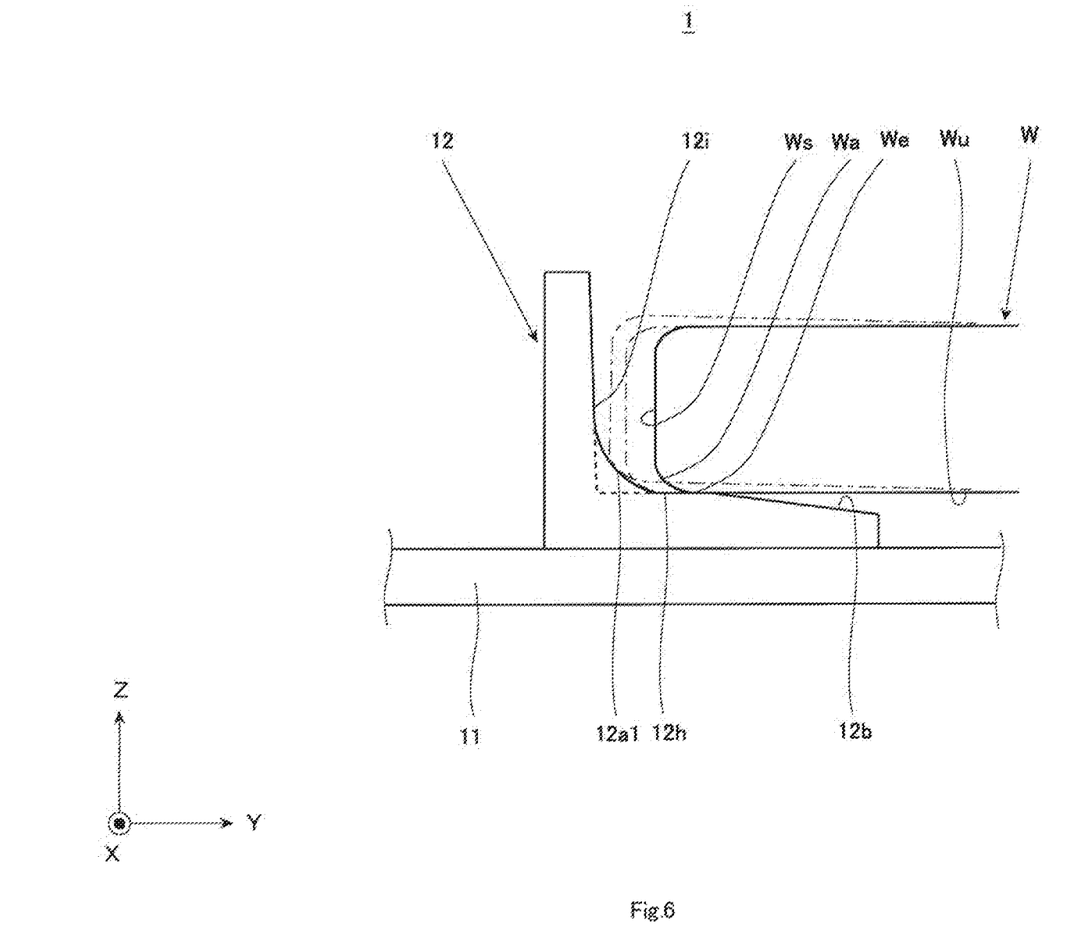
FIG. 6 is an enlarged side view showing a region that is in the vicinity of a guide member of the substrate gripping hand of FIG. 5.

As shown in FIG. 6, when viewed from the horizontal direction, the guide member 12 has a substantially-L shape. A first corner portion 12a1 formed by a bottom surface 12b and an inner wall surface 12i has a curve line shape. Specifically, the first corner portion 12a1 may have a curve line shape indicated by a function which is for example, a quadratic function, a high-dimensional function such as a cubic function, an exponential function, or a logarithmic function, when viewed from the horizontal direction (to be precise, in cross-sectional shape taken along yz plane). The first corner portion 12a1 may be curved.

The first corner portion 12a1 may have a circular-arc shape. In this case, to mitigate an impact generated by a collision, the first corner portion 12a1 may have a curvature radius of 0.5 mm or more. The curvature radius may be set to be equal to or less than the height of the guide member 12. The curvature radius may be set to be equal to or less than the height of the substrate W.

The first corner portion 12a1 with the curve line shape and the inner wall surface 12i may be or may not be continuous with each other. In a case where the first corner portion 12a1 with the curve line shape and the inner wall surface 12i are not continuous with each other, for example, a groove may be formed between the first corner portion 12a1 with the curve line shape and the inner wall surface 12i, or an inclined surface with an obtuse angle formed with respect to the bottom surface may be formed between the first corner portion 12a1 with the curve line shape and the inner wall surface 12i. To mitigate an impact generated by a collision in a case where the substrate W collides with this inclined surface, the inclined surface may be inclined at an angle of 135 degrees or more, 140 degrees or more, 160 degrees or more, or less than 180 degrees.

The base end portion of the bottom surface 12b of the guide member 12 has the horizontal portion 12h. The horizontal portion 12h is parallel to the bottom surface Wb of the substrate W. This allows the substrate W to be held (gripped) horizontally in a state in which the base plate 11 of the substrate gripping hand 1 of the substrate transfer device 101 is oriented to be horizontal.

As shown in FIG. 5, in Embodiment 1, each of the horizontal portions 12h has a substantially rectangular shape, when viewed from a normal direction (from the upper side) of the base plate 11. More specifically, the horizontal portion 12h has a shape in which a pair of sides are parallel to a tangential line of the peripheral surface Ws of the substrate W. Alternatively, the horizontal portion 12h may have a sector shape, when viewed from the normal direction (from the upper side) of the base plate 11.

To allow the substrate W placed inside the container 103 to be easily held, the horizontal portion 12h of the guide member 12 may have a Y-direction (front-rear direction of the substrate transfer device 101) length which is 0.2 mm or more, 0.3 mm or more, or 0.5 mm or more. To prevent the substrate W from getting unfirm while the held substrate W is moved (transferred), the Y-direction length of the horizontal portion 12h may be set to 3.0 mm or less, 2.3 mm or less, or 1.8 mm or less.

As described above, each of the guide members 12 is disposed on the upper surface of the base plate 11 so that the end portion of the substrate W is placed on the horizontal portion 12h. More specifically, the guide member 12 is disposed so that an outermost end We of the lower surface Wu of the substrate W is placed on the horizontal portion 12h. In other words, the guide member 12 is disposed so that the outermost end We of the lower surface Wu of the substrate W overlaps with the horizontal portion 12h, when viewed from the normal direction of the base plate 11.

The end portion of the substrate W is defined as a portion with a predetermined dimension from the peripheral surface Ws of the substrate W. The end portion of the substrate W may be, for example, a ring-shaped portion in a range of 0.7 mm or less from the peripheral surface Ws of the substrate W. The outermost end We of the lower surface Wu of the substrate W refers to an outermost end of the horizontal portion of the lower surface Wu. For example, the outermost end We of the lower surface Wu of the substrate W may conform to the peripheral surface Ws of the substrate W or may be located in a range of 0.7 mm or less from the peripheral surface Ws.

The guide member 12 may be disposed so that the end portion of the substrate W is placed on a portion of the horizontal portion 12h or on the whole of the horizontal portion 12h. In other words, a portion of the horizontal portion 12h of the guide member 12 may overlap with the end portion of the substrate W, or the whole of the horizontal portion 12h of the guide member 12 may overlap with the end portion of the substrate W, when viewed from the normal direction of the base plate 11.

The guide member 12 may be disposed so that the tip end of the horizontal portion 12h is located inward of the inner end of the end portion of the substrate W, when viewed from the normal direction of the base plate 11. The guide member 12 may be disposed so that the base end of the horizontal portion 12h is located outward of the peripheral surface Ws of the substrate W, when viewed from the normal direction of the base plate 11. The guide member 12 may be disposed on the upper surface of the base plate 11 so that a clearance (gap) is formed between the inner wall surface 12i of the guide member 12 and the peripheral surface Ws of the substrate W in a state in which the base plate 11 of the substrate gripping hand 1 is horizontal and the substrate W is placed on the horizontal portion 12h.

As shown in FIG. 6, the guide member 12 has a taper shape in which the thickness of the tip end portion of the bottom surface 12b is reduced toward the tip end. The inner wall surface 12i of the guide member 12 is inclined so that an angle formed between the horizontal portion 12h and the inner wall surface 12i is an obtuse angle (90 degrees or more and less than 180 degrees).

[Operations and Advantages of Semiconductor Treatment Equipment]

Next, the operations and advantages of the semiconductor treatment equipment 100 including the substrate transfer device 101 according to Embodiment 1 will be described with reference to FIGS. 1 to 7. The operations of the manipulator 2 of the substrate transfer device 101 to perform a series of work operations including a plurality of steps will not be described in detail, because the operations are similar to those of a known manipulator. The following operations take place in such a way that the processor 3a of the controller 3 reads and executes the programs stored in the storage section 3b.

Figure 7:
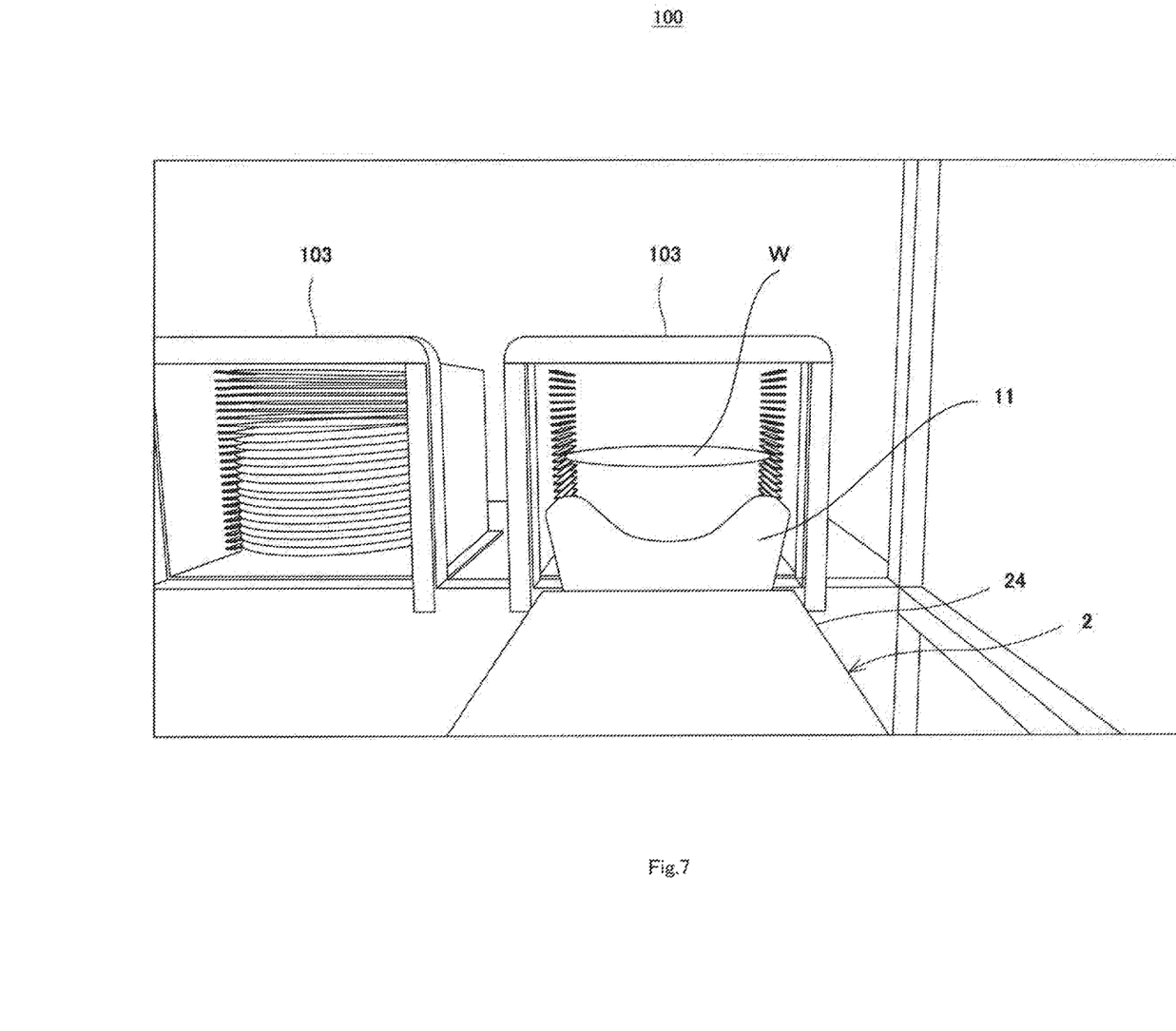
FIG. 7 is a perspective view showing a state in which the substrate transfer device according to Embodiment 1 is operating.

FIG. 7 is a perspective view showing a state in which the substrate transfer device according to Embodiment 1 is operating.

Initially, in response to command information directing the series of work operations which is input to the controller 3 by operating an input device (not shown) by an operator, the controller 3 operates the manipulator 2 to move the substrate gripping hand 1 to a location that is in front of the container 103. At this time, the controller 3 operates the manipulator 2 so that the substrate gripping hand 1 is located under the substrate support parts 103c on which the substrate W to be gripped is placed (see FIG. 7).

Then, the controller 3 operates the manipulator 2 so that the substrate gripping hand 1 is moved to be located under the substrate W. At this time, the controller 3 advances the substrate gripping hand 1 into the container 103 to a location where the substrate W can be placed on the guide members 12 of the substrate gripping hand 1.

Then, the controller 3 operates the manipulator 2 so that the substrate gripping hand 1 is moved in an upward direction, scoops up the substrate W placed on the horizontal portions 12h of the guide members 12, and holds the substrate W. Then, the controller 3 operates the manipulator 2 so that the substrate gripping hand 1 is retracted from the container 103 and transfers the substrate W to one of the substrate treatment devices 110.

Then, the controller 3 operates the manipulator 2 so that the substrate gripping hand 1 holds the substrate W having gone through a particular treatment inside the substrate treatment device 110 and transfers this substrate W to another substrate treatment device 110 which performs a subsequent treatment.

In the substrate gripping hand 1 and the substrate transfer device 101 including this substrate gripping hand 1, according to Embodiment 1, configured as described above, each of the guide members 12 has the L-shape when viewed from the horizontal direction, and the base end portion of the bottom surface 12b has the horizontal portion 12h. In this configuration, the substrate W placed on the horizontal portions 12h of the guide members 12 can be easily gripped and transferred in the horizontal state.

In the substrate gripping hand 1 and the substrate transfer device 101 including this substrate gripping hand 1, according to Embodiment 1, the first corner portion 12a1 of each of the guide members 12 has the curve line shape. In this configuration, even in a case where the end portion of the substrate W collides with the inner wall surface 12i of the guide member 12 due to, for example, a vibration, while the substrate W is gripped and transferred, an impact generated by the collision can be mitigated. In addition, even in a case where the substrate W is tilted due to, for example, a vibration, while the substrate W is gripped and transferred, the end portion of the substrate W moves along (slides down on) the first corner portion 12a1. In this way, the substrate W can return to the horizontal state.

In the substrate gripping hand 1 and the substrate transfer device 101 including this substrate gripping hand 1 according to Embodiment 1, the guide member 12 has a shape in which the bottom surface 12b is inclined so that the thickness of the tip end portion of the bottom surface 12b is reduced toward the tip end. This makes it possible to firmly secure the guide member 12 to the base plate 11 while reducing an area of the bottom surface 12b which contacts the lower surface Wu of the substrate W.

In the substrate gripping hand 1 and the substrate transfer device 101 including the substrate gripping hand 1, according to Embodiment 1, the inner wall surface 12i of each of the guide members 12 is inclined so that an angle formed between the horizontal portion 12h and the inner wall surface 12i is an obtuse angle. This can increase a distance between the inner wall surfaces 12i of the two guide members 12. Therefore, the manipulator 2 can be easily controlled to scoop up the substrate W.

Embodiment 2

In a substrate gripping hand according to Embodiment 2, a guide member has a shape in which a second corner portion which is a corner portion formed between an upper surface and an inner wall surface is formed by a cutting a portion of the guide member.

Hereinafter, an example of the substrate gripping hand according to Embodiment 2 will be described with reference to FIG. 8. A substrate transfer device including the substrate gripping hand according to Embodiment 2 has the same configuration as that of the substrate transfer device according to Embodiment 1. Therefore, the configuration of the substrate transfer device according to Embodiment 2 will not described in detail.

[Configuration of Substrate Gripping Hand]

Figure 8:
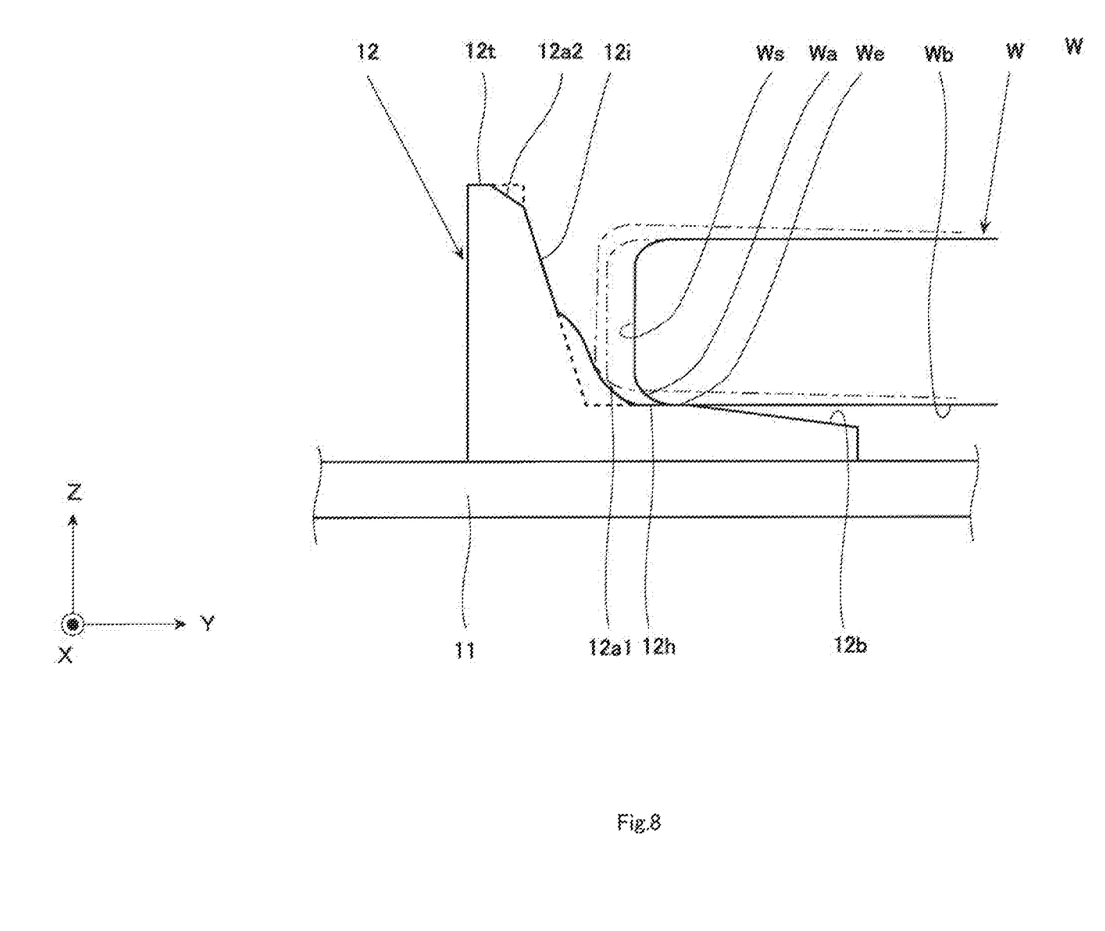
FIG. 8 is an enlarged side view showing a region that is in the vicinity of a guide member of a substrate gripping hand according to Embodiment 2.

FIG. 8 is an enlarged side view showing a region that is in the vicinity of the guide member of the substrate gripping hand according to Embodiment 2. In FIG. 8, the directions of the substrate gripping hand are expressed as the directions of X-axis, Y-axis, and Z-axis in a three-dimensional orthogonal coordinate system. In FIG. 8, a state in which the substrate vibrates is indicated by one-dotted lines.

As shown in FIG. 8, the substrate gripping hand 1 according to Embodiment 2 has basically the same configuration as that of the substrate gripping hand 1 according to Embodiment 1 except the shape of the guide member 12. Specifically, the guide member 12 has a shape in which a cross-sectional shape of the first corner portion 12a1 which is taken along yz plane is expressed as a particular function (in this example, cubic function). In the guide member 12, a second corner portion 12a2 formed by the upper surface 12t and the inner wall surface 12i is formed by cutting a portion of the guide member 12.

The upper surface 12t of the guide member 12 may be inclined so that its height is reduced toward the tip end. This can increase a distance between the upper end portions of the two guide members 12. Therefore, the manipulator 2 can be easily controlled to scoop up the substrate W.

The substrate gripping hand 1 and the substrate transfer device 101 including this substrate gripping hand 1 according to Embodiment 2, configured as described above, obtain the advantages similar to those of the substrate gripping hand 1 and the substrate transfer device 101 including this substrate gripping hand 1 according to Embodiment 1.

In the substrate gripping hand 1 and the substrate transfer device 101 including this substrate gripping hand 1 according to Embodiment 2, the guide member 12 has a shape in which the second corner portion 12a2 formed by the upper surface 12t and the inner wall surface 12i is formed by cutting a portion of the guide member 12. This can increase a distance between the upper end portions of the two guide members 12. Therefore, the manipulator 2 can be easily controlled to scoop up the substrate W.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A substrate gripping hand and a substrate transfer device including this substrate gripping hand, of the present invention, are capable of easily gripping (holding) a substrate in a horizontal state, and are useful in the fields of an industrial robot.

REFERENCE SIGNS LIST 1 substrate gripping hand
2 manipulator
3 controller
3a processor
3b storage section
3c servo control section
11 base plate
12 guide member
12a1 first corner portion
12a2 second corner portion
12b bottom surface
12h horizontal portion
12i inner wall surface
12t upper surface
20 base
21 first link
22 second link
23 third link
24 up-down shaft
100 semiconductor treatment equipment
101 substrate transfer device
102 base
103 container
103a box
103b side wall
103c substrate support part
110 substrate treatment device
L1 rotation axis
L2 rotation axis
L3 rotation axis
W substrate
We end
Ws peripheral surface
Wu lower surface

The invention claimed is:
1. A substrate gripping hand which grips a substrate with a disc shape, the substrate gripping hand comprising:
a base plate; and a guide member provided at the base plate, and having a L-shape when viewed from a horizontal direction, the guide member having a shape in which a base end portion of a bottom surface has a horizontal portion and a first corner portion which is a corner portion formed by the bottom surface and an inner wall surface has a curve line shape, wherein the horizontal portion is spaced from a tip end portion of the bottom surface and is connected to the first corner portion at one end of the horizontal portion and is connected to a non-horizontal portion of the bottom surface of the guide member at another end of the horizontal portion.

2. The substrate gripping hand according to claim 1, wherein
the guide member is disposed at the substrate gripping hand so that an end portion of the substrate is placed on the horizontal portion.

3. The substrate gripping hand according to claim 2, wherein
the guide member is disposed at the base plate so that an outermost end of a bottom surface of the substrate is placed on the horizontal portion.

4. The substrate gripping hand according to claim 3, wherein
the guide member is disposed at the base plate so that an outermost end of a main surface of the substrate overlaps with the horizontal portion, when viewed from a normal direction of the base plate.

5. The substrate gripping hand according to claim 1, wherein
the horizontal portion has a length of 0.2 mm to 3.0 mm.

6. The substrate gripping hand according to claim 1, wherein
the first corner portion of the guide member is curved.

7. The substrate gripping hand according to claim 1, wherein
the first corner portion of the guide member has a circular-arc shape.

8. The substrate gripping hand according to claim 7, wherein
the first corner portion of the guide member has a curvature radius of 0.5 mm or more.

9. The substrate gripping hand according to claim 1, wherein
the guide member has a shape in which the bottom surface is inclined so that the tip end portion of the bottom surface has a thickness reduced toward a tip end thereof.

10. The substrate gripping hand according to claim 1, wherein
the inner wall surface of the guide member is inclined so that an angle formed between the horizontal portion and the inner wall surface is an obtuse angle.

11. The substrate gripping hand according to claim 1, wherein
the guide member has a second corner portion formed by an upper surface and the inner wall surface, the second corner portion being formed by cutting a portion of the guide member.

12. A substrate transfer device comprising the substrate gripping hand according to claim 1.

13. The substrate gripping hand according to claim 1, wherein
a cross-sectional shape of the first corner portion is expressed as a cubic function.

* * * * *